(12) United States Patent
Edwards et al.

(10) Patent No.: US 10,741,741 B2
(45) Date of Patent: Aug. 11, 2020

(54) MULTI HEADER FOR THERMOELECTRIC DEVICE

(71) Applicant: Phononic, Inc., Durham, NC (US)

(72) Inventors: Jesse W. Edwards, Wake Forest, NC (US); Devon Newman, Morrisville, NC (US); Arthur Prejs, Cary, NC (US); Alex R. Guichard, Apex, NC (US); Jason D. Reed, Chapel Hill, NC (US); Kevin Shawne Schneider, Cary, NC (US); Brian Williams, Chapel Hill, NC (US); Robert J. Therrien, Cary, NC (US)

(73) Assignee: Phononic, Inc., Durham, NC (US)

( * ) Notice: Subject to any disclaimer, the term of this patent is extended or adjusted under 35 U.S.C. 154(b) by 268 days.

(21) Appl. No.: 15/628,218

(22) Filed: Jun. 20, 2017

(65) Prior Publication Data

US 2017/0365767 A1    Dec. 21, 2017

Related U.S. Application Data

(60) Provisional application No. 62/352,298, filed on Jun. 20, 2016.

(51) Int. Cl.
| | | |
|---|---|---|
| *F25B 21/02* | (2006.01) | |
| *H01L 35/34* | (2006.01) | |
| *H01L 35/10* | (2006.01) | |
| *H01L 35/08* | (2006.01) | |
| *H01L 35/12* | (2006.01) | |

(52) U.S. Cl.
CPC .............. *H01L 35/34* (2013.01); *H01L 35/08* (2013.01); *H01L 35/10* (2013.01); *H01L 35/12* (2013.01)

(58) Field of Classification Search
CPC ......... H01L 35/34; H01L 35/08; H01L 35/10; H01L 35/12; H05K 7/2079; F28F 9/001; F28D 7/12
USPC ............................................................ 62/3.2
See application file for complete search history.

(56) References Cited

U.S. PATENT DOCUMENTS

| | | | | |
|---|---|---|---|---|
| 5,954,128 A | * | 9/1999 | Harkins | .................... F28D 7/12 165/142 |
| 6,412,547 B1 | * | 7/2002 | Siler | ....................... F28F 9/001 165/149 |
| 2012/0024501 A1 | * | 2/2012 | Campbell | ............ H05K 7/2079 165/104.33 |

* cited by examiner

*Primary Examiner* — Davis D Hwu
(74) *Attorney, Agent, or Firm* — Withrow & Terranova, PLLC (57) ABSTRACT

A thermoelectric device with multiple headers and a method of manufacturing such a device are provided herein. In some embodiments, a thermoelectric device includes multiple thermoelectric legs, a cold header thermally attached to the thermoelectric legs, and a hot header thermally attached to the thermoelectric legs opposite the cold header. At least one of the cold header and the hot header includes at least one score line. According to some embodiments disclosed herein, this the thermal stress on the thermoelectric device can be greatly reduced or relieved by splitting the header into multiple pieces or by scoring the header by a depth X. This enables the use of larger thermoelectric devices and/or thermoelectric devices with an increased lifespan.

25 Claims, 6 Drawing Sheets

MULTI HEADER FOR THERMOELECTRIC DEVICE

RELATED APPLICATIONS

This application claims the benefit of provisional patent application Ser. No. 62/352,298, filed Jun. 20, 2016, the disclosure of which is hereby incorporated herein by reference in its entirety.

FIELD OF THE DISCLOSURE

The present disclosure relates to thermoelectric devices and their manufacture.

BACKGROUND

Thermoelectric devices are solid state semiconductor devices that, depending on the particular application, can be either Thermoelectric Coolers (TECs) or Thermoelectric Generators (TEGs). TECs are solid state semiconductor devices that utilize the Peltier effect to transfer heat from one side of the device to the other, thereby creating a cooling effect on the cold side of the device. Because the direction of heat transfer is determined by the polarity of an applied voltage, thermoelectric devices can be used generally as temperature controllers. Similarly, TEGs are solid state semiconductor devices that utilize the Seebeck effect to convert heat (i.e., a temperature difference from one side of the device to the other) directly into electrical energy. A thermoelectric device includes at least one N-type leg and at least one P-type leg. The N-type legs and the P-type legs are formed of a thermoelectric material (i.e., a semiconductor material having sufficiently strong thermoelectric properties). In order to effect thermoelectric cooling, an electrical current is applied to the thermoelectric device. The direction of current transference in the N-type legs and the P-type legs is parallel to the direction of heat transference in the thermoelectric device. As a result, cooling occurs at the top surface of the thermoelectric device, and the heat is released at the bottom surface of the thermoelectric device.

Thermoelectric systems that use thermoelectric devices are advantageous compared to non-thermoelectric systems because they lack moving mechanical parts, have long lifespans, and can have small sizes and flexible shapes. However, there remains a need for thermoelectric devices with increased performance and longer lifespans.

SUMMARY

A thermoelectric device with multiple headers and a method of manufacturing such a device are provided herein. In some embodiments, a thermoelectric device includes multiple thermoelectric legs, a cold header thermally attached to the thermoelectric legs, and a hot header thermally attached to the thermoelectric legs opposite the cold header. At least one of the cold header and the hot header includes at least one score line. According to some embodiments disclosed herein, the thermal stress on the thermoelectric device can be greatly reduced or relieved by splitting the header into multiple pieces or by scoring the header by a depth X. This enables the use of larger thermoelectric devices and/or thermoelectric devices with an increased lifespan.

In some embodiments, the at least one score line is to a depth of X percent of the thickness of the at least one of the cold header and the hot header. In some embodiments, X is at least three. In some embodiments, X is one hundred and the at least one of the cold header and the hot header is separated into two or more header portions.

In some embodiments, the cold header includes the at least one score line. In some embodiments, X is less than one hundred and the thermoelectric device also includes a seal connecting the cold header and the hot header to protect the plurality of thermoelectric legs.

In some embodiments, the at least one score line includes N score lines along a first axis of the at least one of the cold header and the hot header. In some embodiments, the at least one score line includes N score lines along the first axis and N score lines along a second axis of the at least one of the cold header and the hot header. In some embodiments, the at least one score line includes a number of score lines along a second axis of the at least one of the cold header and the hot header that is different than N.

In some embodiments, at least one of the cold header and the hot header is ceramic. In some embodiments, at least one of the cold header and the hot header has at least one dimension that is longer than 30 millimeters.

In some embodiments, a method of manufacturing a thermoelectric device includes providing multiple thermoelectric legs, thermally attaching a cold header to the thermoelectric legs, and thermally attaching a hot header to the thermoelectric legs opposite the cold header. At least one of the cold header and the hot header includes at least one score line.

In some embodiments, the method also includes providing the at least one score line on the at least one of the cold header and the hot header. In some embodiments, providing the at least one score line on the at least one of the cold header and the hot header occurs before thermally attaching the at least one of the cold header and the hot header to the thermoelectric legs. In some embodiments, providing the at least one score line on the at least one of the cold header and the hot header occurs after thermally attaching the at least one of the cold header and the hot header to the thermoelectric legs.

In some embodiments, the at least one score line is to a depth of X percent of the thickness of the at least one of the cold header and the hot header. In some embodiments, X is at least three. In some embodiments, X is one hundred and the at least one of the cold header and the hot header is separated into two or more header portions.

In some embodiments, the cold header includes the at least one score line. In some embodiments, X is less than one hundred and the thermoelectric device also includes a seal connecting the cold header and the hot header to protect the plurality of thermoelectric legs.

In some embodiments, the at least one score line includes N score lines along a first axis of the at least one of the cold header and the hot header. In some embodiments, the at least one score line includes N score lines along the first axis and N score lines along a second axis of the at least one of the cold header and the hot header. In some embodiments, the at least one score line includes a number of score lines along a second axis of the at least one of the cold header and the hot header that is different than N.

In some embodiments, at least one of the cold header and the hot header is ceramic. In some embodiments, at least one of the cold header and the hot header has at least one dimension that is longer than 30 millimeters.

In some embodiments, a heat pump includes a surround and spacer (SAS) structure comprising a wall defining a first open side and a second open side.

The heat pump also includes an interconnect board enclosed within the SAS structure. The interconnect board includes one or more openings from a first surface of the interconnect board to a second surface of the interconnect board. The one or more openings define locations at which at least one thermoelectric module is to be mounted on the interconnect board.

In some embodiments, the at least one thermoelectric module is mounted on the interconnect board at the locations defined by the one or more openings. Each thermoelectric module of the at least one thermoelectric module includes a plurality of thermoelectric legs; a cold header thermally attached to the plurality of thermoelectric legs; and a hot header thermally attached to the plurality of thermoelectric legs 36 opposite the cold header where at least one of the cold header and the hot header includes at least one score line.

In some embodiments, the heat pump also includes a hot-side heat spreader that is in thermal contact with the hot header of each thermoelectric module of the at least one thermoelectric module and a cold-side heat spreader that is in thermal contact with the cold header of each thermoelectric module of the at least one thermoelectric module. In some embodiments, a periphery of the hot-side heat spreader mechanically contacts the wall of the SAS structure at the first open side, and a periphery of the cold-side heat spreader mechanically contacts the wall of the SAS structure at the second open side such that a compression force applied to the heat pump is absorbed by the SAS structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
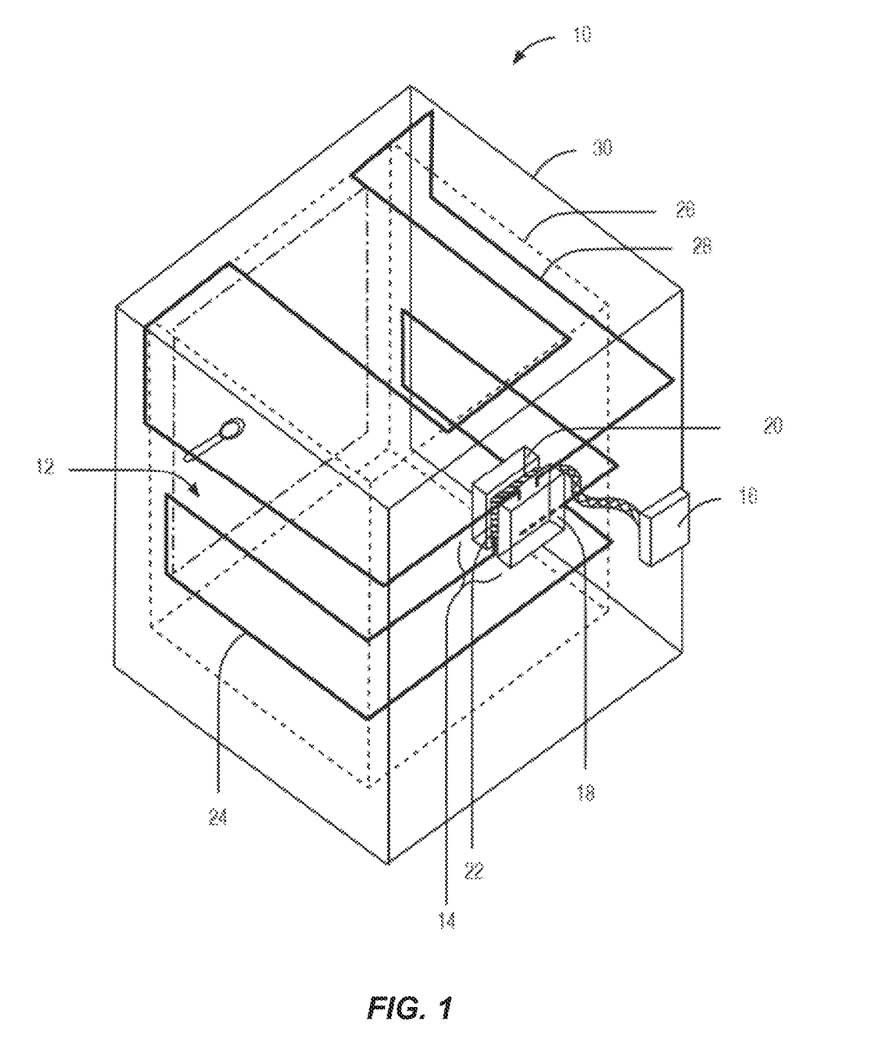
FIG. 1 illustrates a thermoelectric refrigeration system having a cooling chamber, a heat exchanger including at least one Thermoelectric Module (TEM) disposed between a cold side heat sink and a hot side heat sink, and a controller that controls the TEM according to some embodiments of the present disclosure.

FIG. 1 illustrates a thermoelectric refrigeration system 10 having a cooling chamber 12, a heat exchanger 14 including at least one Thermoelectric Module (TEM) 22 (referred to herein singularly as TEM 22 or plural as TEMs 22) disposed between a cold side heat sink 20 and a hot side heat sink 18, and a controller 16 that controls the TEM 22 according to some embodiments of the present disclosure. When a TEM 22 is used to provide cooling it may sometimes be referred to as a Thermoelectric Cooler (TEC) 22.

The TEMs 22 are preferably thin film devices. When one or more of the TEMs 22 are activated by the controller 16, the activated TEMs 22 operate to heat the hot side heat sink 18 and cool the cold side heat sink 20 to thereby facilitate heat transfer to extract heat from the cooling chamber 12. More specifically, when one or more of the TEMs 22 are activated, the hot side heat sink 18 is heated to thereby create an evaporator and the cold side heat sink 20 is cooled to thereby create a condenser, according to some embodiments of the current disclosure.

Acting as a condenser, the cold side heat sink 20 facilitates heat extraction from the cooling chamber 12 via an accept loop 24 coupled with the cold side heat sink 20. The accept loop 24 is thermally coupled to an interior wall 26 of the thermoelectric refrigeration system 10. The interior wall 26 defines the cooling chamber 12. In one embodiment, the accept loop 24 is either integrated into the interior wall 26 or integrated directly onto the surface of the interior wall 26. The accept loop 24 is formed by any type of plumbing that allows for a cooling medium (e.g., a two-phase coolant) to flow or pass through the accept loop 24. Due to the thermal coupling of the accept loop 24 and the interior wall 26, the cooling medium extracts heat from the cooling chamber 12 as the cooling medium flows through the accept loop 24. The accept loop 24 may be formed of, for example, copper tubing, plastic tubing, stainless steel tubing, aluminum tubing, or the like.

Acting as an evaporator, the hot side heat sink 18 facilitates rejection of heat to an environment external to the cooling chamber 12 via a reject loop 28 coupled to the hot side heat sink 18. The reject loop 28 is thermally coupled to an outer wall 30, or outer skin, of the thermoelectric refrigeration system 10.

The thermal and mechanical processes for removing heat from the cooling chamber 12 are not discussed further. Also, it should be noted that the thermoelectric refrigeration system 10 shown in FIG. 1 is only a particular embodiment of a use and control of a TEM 22. All embodiments discussed herein should be understood to apply to thermoelectric refrigeration system 10 as well as any other use of a TEM 22.

Continuing with the example embodiment illustrated in FIG. 1, the controller 16 operates to control the TEMs 22 in order to maintain a desired set point temperature within the cooling chamber 12. In general, the controller 16 operates to selectively activate/deactivate the TEMs 22, selectively control an amount of power provided to the TEMs 22, and/or selectively control a duty cycle of the TEMs 22 to maintain the desired set point temperature. Further, in preferred embodiments, the controller 16 is enabled to separately, or independently, control one or more and, in some embodiments, two or more subsets of the TEMs 22, where each subset includes one or more different TEMs 22. Thus, as an example, if there are four TEMs 22, the controller 16 may be enabled to separately control a first individual TEM 22, a second individual TEM 22, and a group of two TEMs 22. By this method, the controller 16 can, for example, selectively activate one, two, three, or four TEMs 22 independently, at maximized efficiency, as demand dictates.

It should be noted that the thermoelectric refrigeration system 10 is only an example implementation and that the systems and methods disclosed herein are applicable to other uses of thermoelectric devices as well.

Thermoelectric devices such as TEM 22 undergo physical stress from the thermal cycling. This may result from the thermoelectric device being powered on and off. This may also result from the amount of power to the thermoelectric device varying over time. In some cases, even a thermoelectric device maintained with a constant amount of applied power undergoes physical stress.

Figure 2:
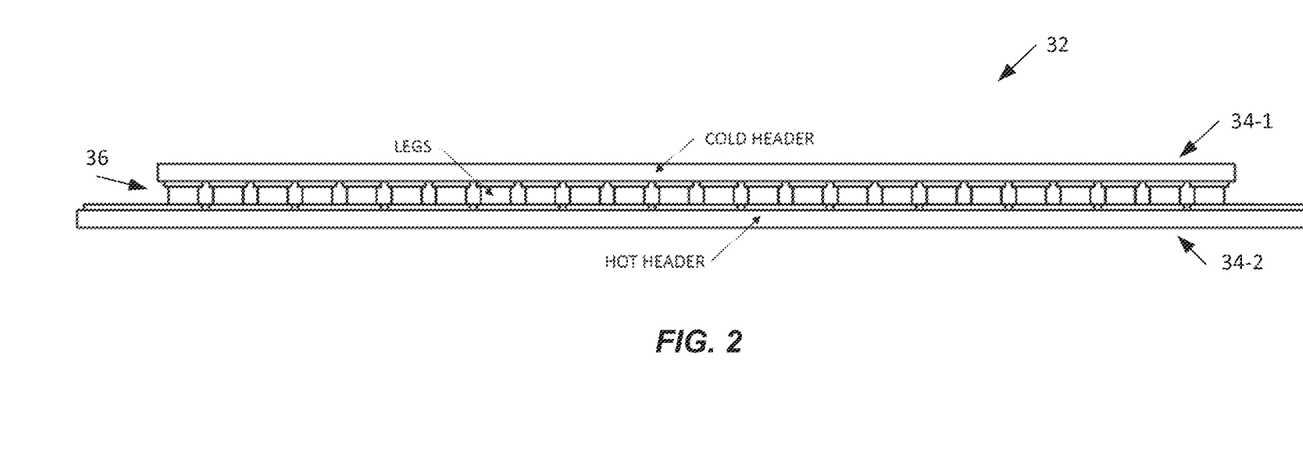
FIG. 2 illustrates a side view of a thermoelectric device according to some embodiments of the present disclosure.

Large thermoelectric devices (e.g., a thermoelectric device larger than approximately 30 millimeters (mm) according to some embodiments) are susceptible to failure from thermal cycling. A common thermoelectric device 32 is shown in FIG. 2. The thermoelectric device 32 consists of two headers 34, commonly referred to as cold header 34-1 and a hot header 34-2, and a series of legs 36 that are soldered to each header. In some embodiments, the headers 34 are made of ceramic. When the thermoelectric device 32 is operated, heat is moved from the cold header 34-1 to the hot header 34-2, causing a temperature difference between the headers 34. This temperature difference results in thermal expansion and contraction of each header.

Figure 3:
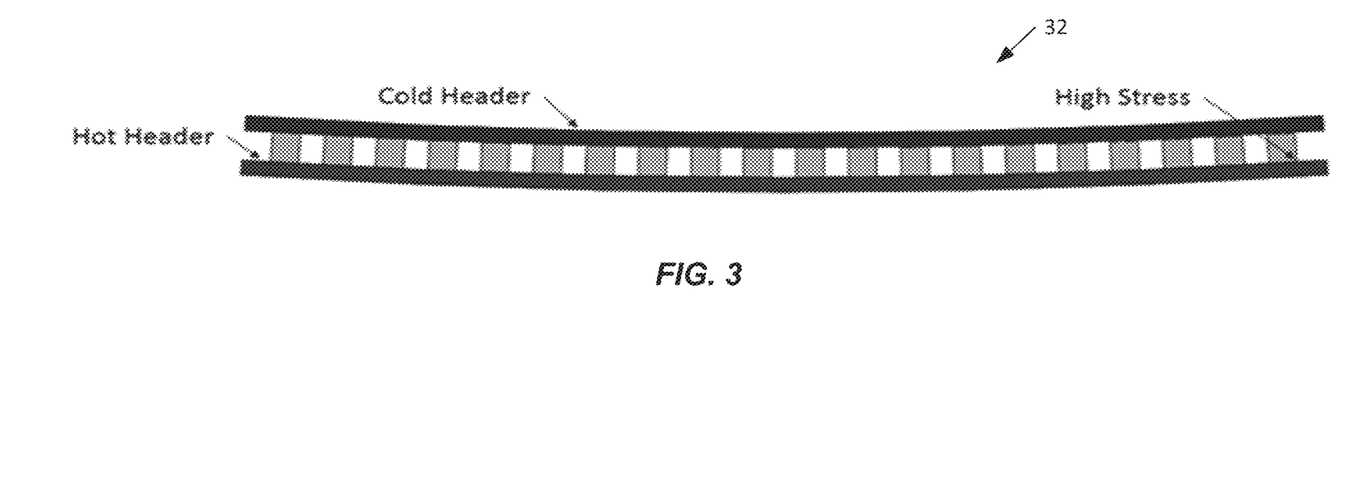
FIG. 3 illustrates a side view of a thermoelectric device under thermal stress according to some embodiments of the present disclosure.

Specifically, as shown in FIG. 3, the cold header 34-1 experiences contraction while the hot header 34-2 experiences expansion. This thermal stress may cause the device to flex and induces stress in the solder joints between the legs 36 and the headers 34. This thermal stress increases with the size of the thermoelectric device 32. The thermal stress may also increase when the efficiency of the thermoelectric device 32 leads to an increased temperature difference between the headers 34.

In some embodiments, the thermal stress is highest at the leg 36 furthest from the center of the thermoelectric device 32, since this is the area of highest expansion and contraction for each header 34.

A thermoelectric device with multiple headers and a method of manufacturing such a device are provided herein. In some embodiments, a thermoelectric device includes multiple thermoelectric legs, a cold header thermally attached to the thermoelectric legs, and a hot header thermally attached to the thermoelectric legs opposite the cold header. At least one of the cold header and the hot header includes at least one score line. According to some embodiments disclosed herein, this the thermal stress on the thermoelectric device can be greatly reduced or relieved by splitting the header into multiple pieces or by scoring the header by a depth X. This enables the use of larger thermoelectric devices and/or thermoelectric devices with an increased lifespan.

Figure 4:
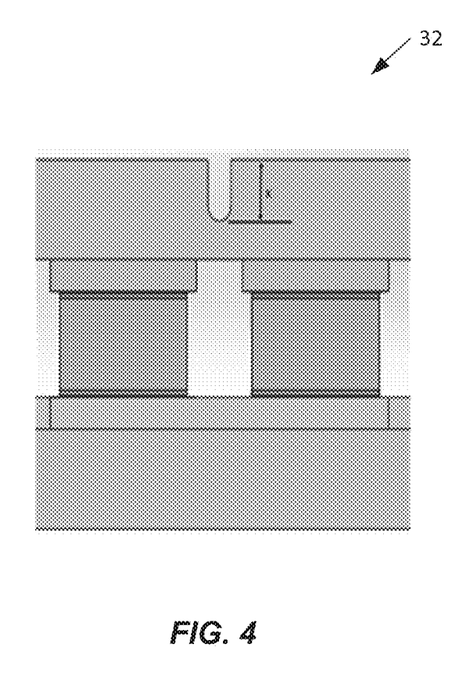
FIG. 4 illustrates a header of a thermoelectric device with a score mark according to some embodiments of the present disclosure.

In some embodiments, the depth X is greater than or equal to 3% of the thickness of the cold header 34-1. In some embodiments, the depth X may be up to 100% of the total thickness of the cold header 34-1. FIG. 4 illustrates a single score to a depth X in a thermoelectric device 32 according to some embodiments.

Figure 5:
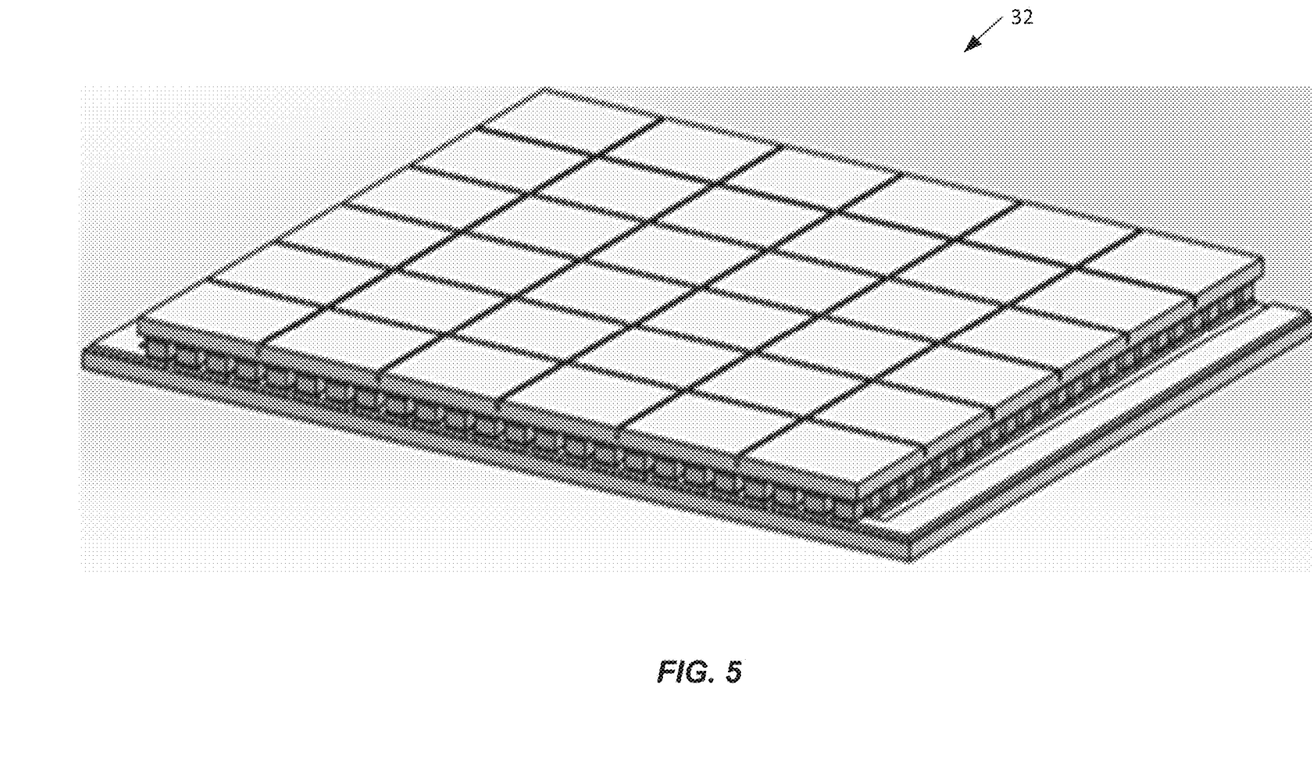
FIG. 5 illustrates a header of a thermoelectric device with multiple score marks according to some embodiments of the present disclosure.

In addition, in some embodiments, the cold header 34-1 may include a total of N separate scores. In some embodiments, there may be N scores along both axes of the thermoelectric device 32. FIG. 5 illustrates a cold header 34-1 of a thermoelectric device 32 with multiple score marks according to some embodiments of the present disclosure. In this example, N=5 scores in both axes of the thermoelectric device 32. While these examples include the same number of scores in each axis, the embodiments of the present disclosure are not limited thereto.

Figure 6:
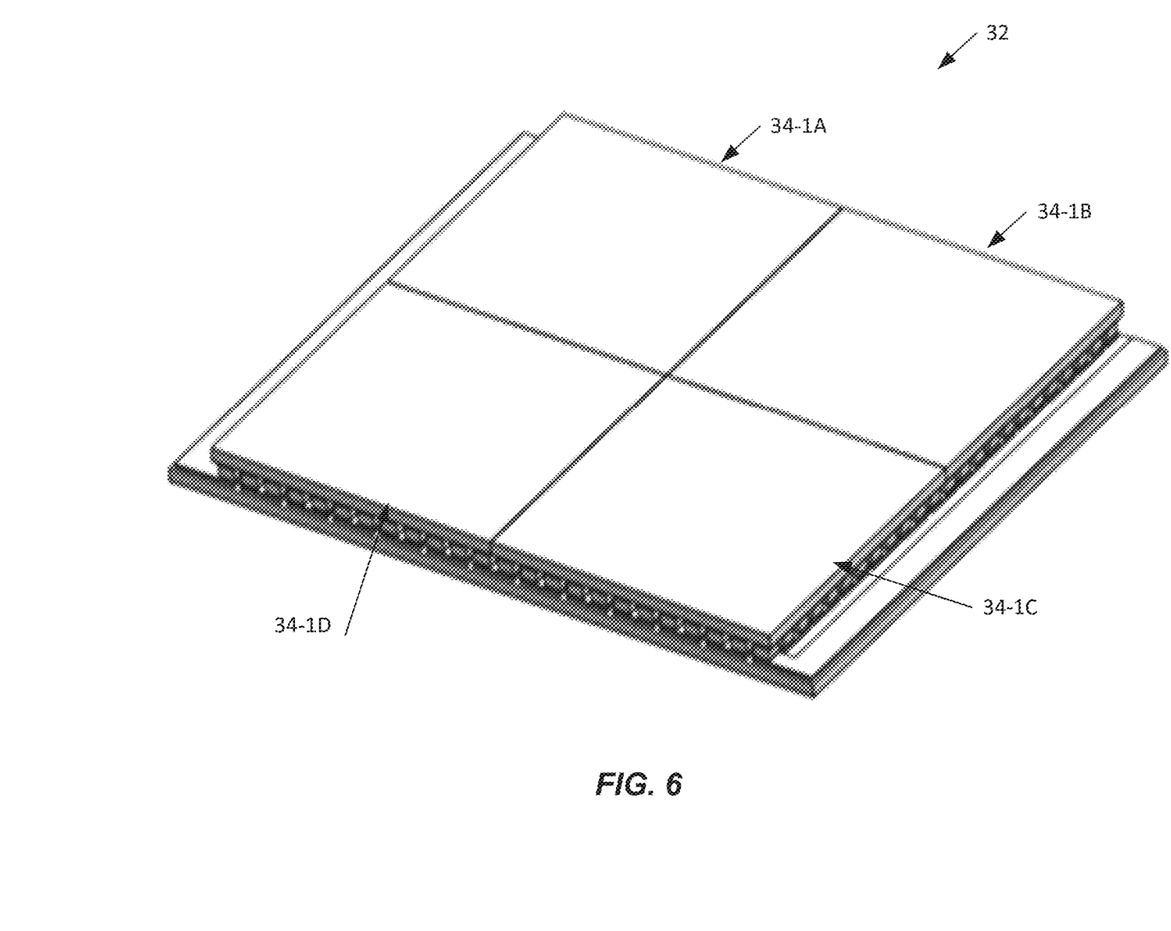
FIG. 6 illustrates a thermoelectric device with multiple headers according to some embodiments of the present disclosure.

FIG. 6 illustrates a thermoelectric device 32 with multiple headers 34 according to some embodiments of the present disclosure. In this example, the scores are to a depth of 100%, all the way through the cold header 34-1. With only N=1 score in each axis, the cold header 34-1 is divided into four separate cold header portions 34-1A through 34-1D. In this example, the separated cold header 34-1 provides the most amount of flexing. This may allow the thermoelectric device 32 to be larger without failing due to the thermal stress. For instance, the thermoelectric device 32 of FIG. 6 may be four times larger than the thermoelectric devices 32 of FIGS. 2 and 3 that are not scored at all.

In some embodiments, scoring to a depth X less than 100% is preferable as it may simplify the assembly process of the thermoelectric device 32. This scoring, as in FIGS. 4 and 5, would reduce the flex of the thermoelectric device 32 by allowing the hot header 34-2 to expand more in plane as the cold header 34-1 is not constraining the expansion over the full length. As above, this scoring would allow larger thermoelectric devices 32 to be made without introducing reliability risk for thermal cycle failure.

An additional advantage of scoring to a depth X less than 100% is that this type of thermoelectric device 32 could still be sealed. Most sealing techniques involve a bead of sealant around the perimeter of the thermoelectric device 32. Sealing around each of the separated cold headers such as cold header portions 34-1A through 34-1D of FIG. 6 would multiply the parasitic heat loss through the sealant. This would reduce the performance of the thermoelectric device 32. But scoring to a depth X less than 100% would allow the same sealing techniques as an unscored thermoelectric device 32 without compromising as much performance as with the sealing needed to seal the separated headers.

Scoring the cold header 34-1 also provides an additional benefit in some embodiments. While the primary goal is to prevent the failure of the thermoelectric device 32 due to thermal stress, a secondary goal may be to allow the thermoelectric device 32 to fail more gracefully. For instance, if the unscored thermoelectric device 32 of FIGS. 2 and 3 breaks, the headers (possibly made of ceramic) may crack or otherwise break in a seemingly random way. Depending on where and how the thermoelectric device 32 is being used, this may lead to additional failures.

However, a thermoelectric device 32 with a scored cold header 34-1 is much more likely to crack or break along one or more of the score lines. In some embodiments, the thermoelectric device 32 may be designed such that a failure along one of the score lines does not lead to additional failures in the overall device. For instance, such a thermoelectric device 32 may be designed to allow a crack along a score line without causing an electrical short or an electrical open circuit. In at least this way, the thermoelectric device 32 may be enabled to fail less often and more gracefully than an unscored thermoelectric device 32.

Figure 7:
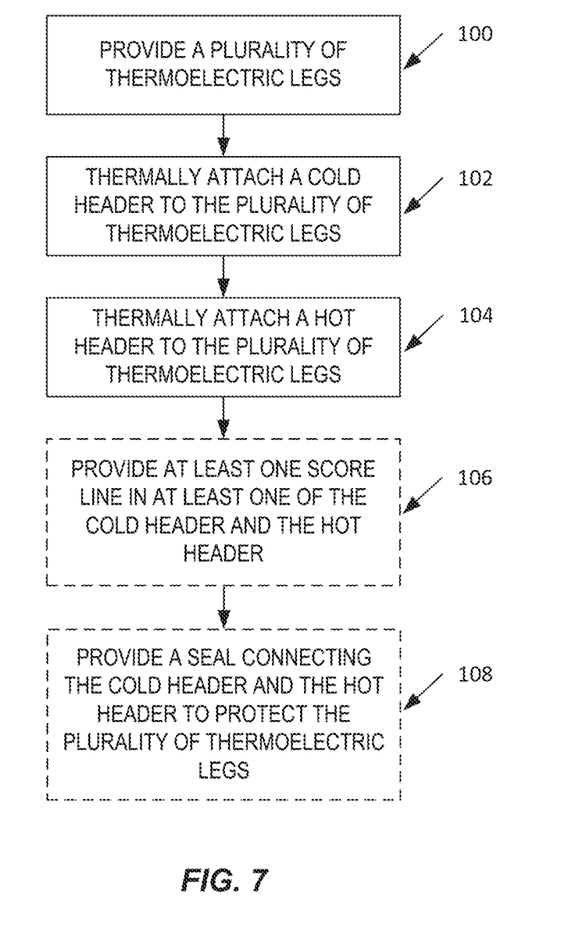
FIG. 7 illustrates a method of manufacturing a thermoelectric device according to some embodiments of the present disclosure.

FIG. 7 illustrates a method of manufacturing a thermoelectric device 32 according to some embodiments of the present disclosure. The method includes providing a plurality of thermoelectric legs 36 (step 100). These may be any suitable thermoelectric legs 36. The method also includes thermally attaching a cold header 34-1 to the plurality of thermoelectric legs 36 (step 102). This thermal attachment may be accomplished by soldering or other sufficient means. This attachment may also provide electrical connectivity depending on the implementation of the thermoelectric device 32.

The method of manufacturing also includes thermally attaching a hot header 34-2 to the plurality of thermoelectric legs 36 opposite the cold header 34-1 (step 104). At least one of the cold header 34-1 and the hot header 34-2 includes at least one score line as discussed herein. In some embodiments, this at least one score line is accomplished by providing the at least one score line on the at least one of the cold header 34-1 and the hot header 34-2 (step 106). This providing may be accomplished in any suitable manner such as cutting, ablating, etc. In some embodiments, this score line is provided before assembly while in other embodiments it is provided after assembly.

As discussed above, the thermoelectric device 32 may benefit from being sealed. In some embodiments, the method of manufacturing also includes providing a seal connecting the cold header 34-1 and the hot header 34-2 to protect the plurality of thermoelectric legs 36 (step 108).

This method of manufacturing a thermoelectric device 32 may be used to produce any type of thermoelectric device 32 and the thermoelectric device 32 may be used in any suitable application. One potential use would be to use such a thermoelectric device 32 in an enclosed heat pump. This heat pump would include a surround and spacer (SAS) structure comprising a wall defining a first open side and a second open side.

The heat pump would also include an interconnect board enclosed within the SAS structure. The interconnect board includes one or more openings from a first surface of the interconnect board to a second surface of the interconnect board. The one or more openings define locations at which at least one thermoelectric module is to be mounted on the interconnect board.

In some embodiments, the at least one thermoelectric module is mounted on the interconnect board at the locations defined by the one or more openings. Each thermoelectric module of the at least one thermoelectric module is a thermoelectric device 32 or includes features similar to a thermoelectric device 32 such as a plurality of thermoelectric legs; a cold header thermally attached to the plurality of thermoelectric legs; and a hot header thermally attached to the plurality of thermoelectric legs 36 opposite the cold header where at least one of the cold header and the hot header includes at least one score line.

In some embodiments, the heat pump also includes a hot-side heat spreader that is in thermal contact with the hot header of each thermoelectric module of the at least one thermoelectric module and a cold-side heat spreader that is in thermal contact with the cold header of each thermoelectric module of the at least one thermoelectric module. In some embodiments, a periphery of the hot-side heat spreader mechanically contacts the wall of the SAS structure at the first open side, and a periphery of the cold-side heat spreader mechanically contacts the wall of the SAS structure at the second open side such that a compression force applied to the heat pump is absorbed by the SAS structure.

Those skilled in the art will recognize improvements and modifications to the preferred embodiments of the present disclosure. All such improvements and modifications are considered within the scope of the concepts disclosed herein and the claims that follow.

What is claimed is:

1. A thermoelectric device comprising:
a plurality of thermoelectric legs;
a cold header thermally attached to the plurality of thermoelectric legs; and
a hot header thermally attached to the plurality of thermoelectric legs opposite the cold header;
where at least one of the cold header and the hot header includes at least one score line.

2. The thermoelectric device of claim 1 wherein the at least one score line is to a depth of X percent of the thickness of the at least one of the cold header and the hot header.

3. The thermoelectric device of claim 2 wherein X is at least three.

4. The thermoelectric device of claim 2 wherein X is one hundred and the at least one of the cold header and the hot header is separated into two or more header portions.

5. The thermoelectric device of claim 1 wherein the cold header includes the at least one score line.

6. The thermoelectric device of claim 2 wherein X is less than one hundred and the thermoelectric device further comprises a seal connecting the cold header and the hot header to protect the plurality of thermoelectric legs.

7. The thermoelectric device of claim 1 wherein the at least one score line comprises N score lines along a first axis of the at least one of the cold header and the hot header.

8. The thermoelectric device of claim 7 wherein the at least one score line comprises N score lines along the first axis and N score lines along a second axis of the at least one of the cold header and the hot header.

9. The thermoelectric device of claim 7 wherein the at least one score line comprises a number of score lines along a second axis of the at least one of the cold header and the hot header that is different than N.

10. The thermoelectric device of claim 1 wherein at least one of the cold header and the hot header is comprised of ceramic.

11. The thermoelectric device of claim 1 wherein at least one of the cold header and the hot header has at least one dimension that is longer than 30 millimeters.

12. A method of manufacturing a thermoelectric device comprising:
providing a plurality of thermoelectric legs;
thermally attaching a cold header to the plurality of thermoelectric legs; and
thermally attaching a hot header to the plurality of thermoelectric legs opposite the cold header;
where at least one of the cold header and the hot header includes at least one score line.

13. The method of claim 12 further comprising:
providing the at least one score line on the at least one of the cold header and the hot header.

14. The method of claim 13 wherein providing the at least one score line on the at least one of the cold header and the hot header occurs before thermally attaching the at least one of the cold header and the hot header to the plurality of thermoelectric legs.

15. The method of claim 13 wherein providing the at least one score line on the at least one of the cold header and the hot header occurs after thermally attaching the at least one of the cold header and the hot header to the plurality of thermoelectric legs.

16. The method of claim 12 wherein the at least one score line is to a depth of X percent of the thickness of the at least one of the cold header and the hot header.

17. The method of claim 16 wherein X is at least three.

18. The method of claim 16 wherein X is one hundred and the at least one of the cold header and the hot header is separated into two or more header portions.

19. The method of claim 12 wherein the cold header includes the at least one score line.

20. The method of claim 12 wherein X is less than one hundred and the method further comprises:
providing a seal connecting the cold header and the hot header to protect the plurality of thermoelectric legs.

21. The method of claim 12 wherein the at least one score line comprises N score lines along a first axis of the at least one of the cold header and the hot header.

22. The method of claim 21 wherein the at least one score line comprises N score lines along the first axis and N score lines along a second axis of the at least one of the cold header and the hot header.

23. The method of claim 12 wherein at least one of the cold header and the hot header is comprised of ceramic.

24. The method of claim 12 wherein at least one of the cold header and the hot header has at least one dimension that is longer than 30 millimeters.

25. A heat pump, comprising:
a surround and spacer (SAS) structure comprising a wall defining a first open side and a second open side;
an interconnect board enclosed within the SAS structure, the interconnect board comprising one or more openings from a first surface of the interconnect board to a second surface of the interconnect board, the one or more openings defining locations at which at least one thermoelectric module is to be mounted on the interconnect board;
the at least one thermoelectric module mounted on the interconnect board at the locations defined by the one or more openings, each thermoelectric module of the at least one thermoelectric module comprising:
a plurality of thermoelectric legs;
a cold header thermally attached to the plurality of thermoelectric legs; and
a hot header thermally attached to the plurality of thermoelectric legs opposite the cold header;
where at least one of the cold header and the hot header includes at least one score line;
a hot-side heat spreader that is in thermal contact with the hot header of each thermoelectric module of the at least one thermoelectric module; and
a cold-side heat spreader that is in thermal contact with the cold header of each thermoelectric module of the at least one thermoelectric module;
wherein a periphery of the hot-side heat spreader mechanically contacts the wall of the SAS structure at the first open side, and a periphery of the cold-side heat spreader mechanically contacts the wall of the SAS structure at the second open side such that a compression force applied to the heat pump is absorbed by the SAS structure.

* * * * *